(12) United States Patent
McBeath et al.

(10) Patent No.: US 7,071,777 B2
(45) Date of Patent: Jul. 4, 2006

(54) DIGITAL MEMORY-BASED PREDISTORTION TECHNIQUE

(75) Inventors: Sean M. McBeath, Keller, TX (US); Danny T. Pinckley, Arlington, TX (US)

(73) Assignee: Motorola, Inc., Schaumburg, IL (US)

( * ) Notice: Subject to any disclaimer, the term of this patent is extended or adjusted under 35 U.S.C. 154(b) by 60 days.

(21) Appl. No.: 10/977,445

(22) Filed: Oct. 29, 2004

(65) Prior Publication Data
US 2005/0116775 A1  Jun. 2, 2005

Related U.S. Application Data

(60) Provisional application No. 60/526,207, filed on Dec. 2, 2003.

(51) Int. Cl.
*H03F 1/26* (2006.01)

(52) U.S. Cl. .................... 330/149; 330/136
(58) Field of Classification Search ........... 330/149, 330/136
See application file for complete search history.

(56) References Cited

U.S. PATENT DOCUMENTS

| | | |
|---|---|---|
| 5,867,065 A | 2/1999 | Leyendecker |
| 6,216,100 B1 * | 4/2001 | Meghdadi et al. ............ 703/15 |
| 6,512,417 B1 * | 1/2003 | Booth et al. ................ 330/149 |
| 6,956,433 B1 * | 10/2005 | Kim et al. ................... 330/149 |
| 2004/0121741 A1 * | 6/2004 | Rashev et al. ........... 455/114.3 |
| 2004/0179629 A1 * | 9/2004 | Song et al. ................. 375/296 |
| 2005/0001684 A1 * | 1/2005 | Braithwaite ................ 330/263 |

FOREIGN PATENT DOCUMENTS

| | | |
|---|---|---|
| GB | 2388984 A | 11/2003 |
| WO | WO 03/043183 A1 | 5/2003 |
| WO | WO 03/085822 A1 | 10/2003 |

* cited by examiner

*Primary Examiner*—Patricia Nguyen
(74) *Attorney, Agent, or Firm*—Indira Saladi

(57) ABSTRACT

The present invention discloses a system and a method for memory-based predistortion to reduce the distortion effects introduced by a power amplifier. The distortion effects include both memoryless and memory effects. The input and the corresponding output values of the power amplifier are measured to determine models used for predistortion. Using these models, first, an amplitude memory signal representing the amplitude memory effects of the power amplifier is obtained. Then, the amplitude memory signal is subtracted from the input signal. On the resulting signal, memoryless amplitude predistortion and memory-based phase predistortion are performed to get a predistorted signal. Further, an inverse model of the linear response of the power amplifier is implemented on the predistorted signal. Finally, the output of the inverse model is amplified by the power amplifier to obtain an output signal having reduced memoryless and memory-based effects.

28 Claims, 7 Drawing Sheets

DIGITAL MEMORY-BASED PREDISTORTION TECHNIQUE

BACKGROUND

The current invention is broadly related to power amplifiers and more specifically, to predistortion techniques used to compensate for memoryless and memory effects associated with power amplifiers.

Power amplifiers are used in communication systems to amplify communication signals before they are transmitted. Every power amplifier has an associated amplitude gain and phase shift characteristics. An ideal power amplifier has a constant gain and introduces constant delay (that is linear phase shift with frequency) at its output over the entire range of input signal values.

In practice, however, power amplifiers deviate from the ideal behavior described above. A non-ideal power amplifier introduces distortion effects in the output signal. The distortion effects are characterized as memoryless and memory effects. The memoryless effects include non-constant amplitude gain and non-constant phase shift introduced by the power amplifier.

The memory effects arise because even the nonlinear effect of the power amplifier is not constant with time. Thus, the same input signal gives different output signals at different times. The distortion effects introduced by a power amplifier are not constant and change with time due to temperature changes, voltage variations, bias changes, aging and the like. These non-constant distortion effects are responsible for introduction of the memory effects in the output signals.

To eliminate the above-mentioned distortion effects in a signal, the signal is predistorted. Predistortion is distorting the signal before it enters the power amplifier so that the memoryless and memory effects introduced by the power amplifier are cancelled or, at least, reduced.

Predistorting the input signal with the inverse of memoryless effects involves insertion of a nonlinear module between the input signal and the power amplifier so that the overall characteristics of the nonlinear module and the power amplifier are similar to that of a linear memoryless power amplifier.

To reduce the memory effects in a signal, it is important for the predistortion system to adapt to the dynamic changes that occur in the power amplifier. Compensation for the dynamic changes in the power amplifier can be achieved through a feedback loop in the predistortion system. The feedback loop enables the predistortion system to adapt to the changes in the characteristics of the power amplifier.

The first step in predistortion involves estimation of the magnitude of the distortion effects introduced in a signal by a power amplifier. Then, the input signal is predistorted by an inverse of the estimated distortion effects. Subsequently, the predistorted signal is passed through the power amplifier. The predistorted input signal has reduced distortion effects after amplification due to the neutralization of the distortion effects.

There are two types of techniques existing in the art for predistortion of communication signals, memoryless predistortion techniques and memory-based predistortion techniques.

Memoryless predistortion techniques reduce the memoryless effects in the amplified communication signal. However, these techniques are not able to eliminate memory effects.

Memory-based predistortion techniques are capable of eliminating the memory effects in addition to the memoryless effects. Therefore, memory-based predistortion techniques are more effective in removing distortion effects introduced by a power amplifier than memoryless predistortion techniques.

Some patents that disclose methods for carrying out memory-based predistortion are discussed hereinafter.

WIPO patent application number 01/05026 A1 titled "A Wideband Digital Predistortion Linearizer for Nonlinear Amplifiers", assigned to Datum Telegraphic, Inc., Vancouver, British Columbia, Canada, discloses a digital compensation signal processing (DCSP) component. The DCSP component predistorts an input transmission signal to compensate for the frequency and time dependent distortion characteristics of a nonlinear amplifier. The DCSP component comprises a data structure for storing compensation parameters. New compensation parameters are added for every signal sample being predistorted according to the last compensation parameters stored in the DCSP component.

Another U.S. Pat. No. 6,587,514 B1 titled "Digital Predistortion Methods for Wideband Amplifiers", assigned to PMC-Sierra, Inc., Santa Clara, Calif., USA, discloses a predistortion system that compensates for a nonlinear amplifier's frequency and time dependent distortion characteristics. Various sets of compensation parameters are generated periodically and written to a data structure by an adaptive processing component. The adaptive processing component performs a non-real time analysis of amplifier input and output signals to generate compensation parameters.

Further, a WIPO patent application number 02/095932 A1 titled "Digitally Implemented Predistorter Control Mechanism for Linearizing High Efficiency RF Power Amplifiers", assigned to Spectrian Corporation, Sunnyvale, Calif., USA discloses a digital signal processor. The digital signal processor uses two signal processing operators to carry out predistortion. The first signal processing operator represents an inverse of the dynamic memory effects in the nonlinear transfer characteristic of the amplifier. The second signal processing operator represents an inverse of static nonlinearities in the transfer characteristic of the amplifier. These two signal operators are used to eliminate nonlinearities and memory effects from the amplified signal.

Finally, a WIPO patent application number 03/043183 A1 titled "Digital Linearization Circuit", assigned to Telefonaktiebolaget Lm Ericsson, Stockholm, Sweden discloses a solution for minimizing distortion characteristics due to power amplifiers, including memory effects. The solution is based on adaptive nonlinear performance observations. The physical cause for the distortion is compensated for in the application. A predistorter digital circuit is derived that has an inverse functionality of the digital device model to eliminate the distortion effects.

However, a drawback in the above-mentioned predistortion techniques is that they are computationally intensive. The complexity of computations is introduced by the method of calculating and implementing the inverse of the memory effects, which is required to reduce the said memory effects.

Therefore, keeping the above discussion into perspective, there is a need for a memory-based predistortion technique that eliminates memory effects in a computationally efficient way.

SUMMARY

The present invention discloses a system and a method for memory-based predistortion of a signal input to a power amplifier.

According to an embodiment, predistortion is performed in the present invention as follows. First, the memory effects introduced in the amplitude of the output signal due to the power amplifier are modeled and the output of this model is subtracted from the input signal to get an amplitude memory-subtracted signal. Memoryless amplitude predistortion is performed on this amplitude memory-subtracted signal by passing the signal through the inverse model of the memoryless amplitude effects. Once the amplitude memory effects have been subtracted and predistortion for memoryless amplitude effects has been performed, memory-based phase predistortion is carried out. Memory-based phase predistortion is carried out by passing an amplitude-predistorted signal through an inverse model of both the memory and memoryless effects in the phase. Thereafter, a phase-predistorted signal is predistorted using an input correction filter. The input correction filter reduces the computational complexity of memory-based models. Further, the models used for predistortion are updated to account for the variations in the characteristics of the power amplifier. These variations, occurring due to external factors such as temperature and time, are determined by comparing the output signal of the power amplifier with the input signal. These determined variations are used to update the various models being used for predistortion.

In another embodiment of the invention, the phase predistorted signal is directly passed through a power amplifier.

In yet another embodiment of the invention, the signal obtained after memoryless amplitude predistortion is directly passed through the power amplifier. That is, phase predistortion is not performed.

The present invention has several advantages. First, the invention takes into account both the memoryless and memory effects introduced by the power amplifier for performing predistortion. Second, the invention updates the models used for predistortion to take into account the variations in the characteristics of the power amplifier. Variations in the characteristics occur with time due to changes in external conditions such as temperature. Third, the invention eliminates the need to compute a memory-based AM/AM predistortion model to perform amplitude predistortion thereby becoming computationally efficient. Finally, the use of the Input Correction Filter helps reduce the computational complexity of the predistortion process.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which.

DESCRIPTION OF PREFERRED EMBODIMENTS

Figure 1:
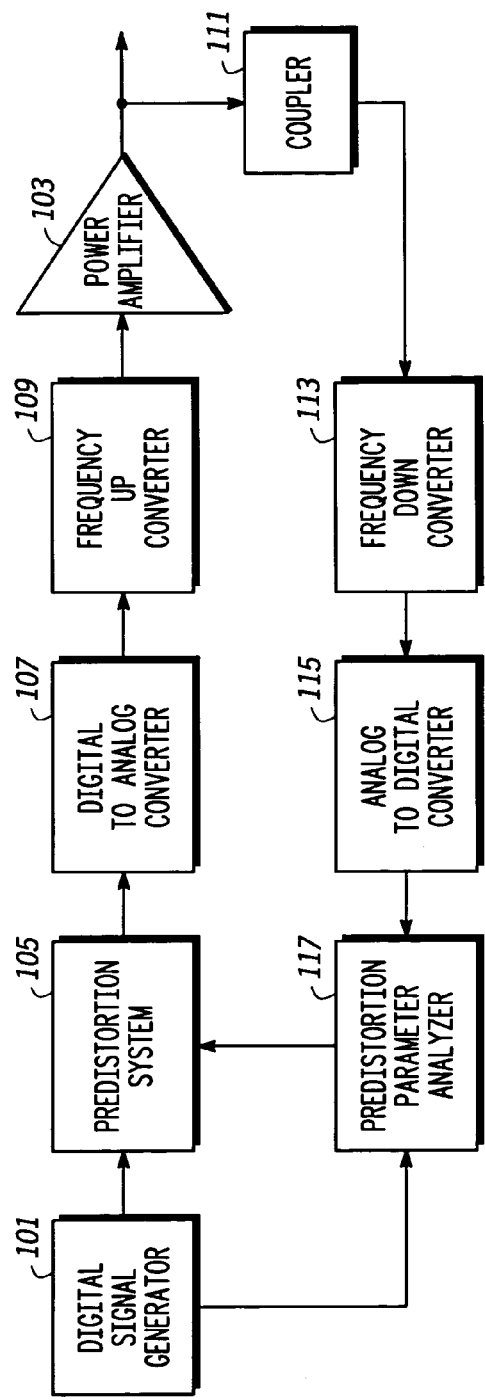
FIG. 1 is a block diagram illustrating an environment in which the present invention operates.

The present invention discloses a system and a method for memory-based predistortion of an input signal to a power amplifier. A typical power amplifier when used to amplify an input signal exhibits memory and memoryless effects, such as non-constant amplitude gain and non-constant phase change that are present at the output. To reduce these effects in the output of the power amplifier, predistortion is performed on the input signal. The idea behind predistortion is to insert a predistortion module before the power amplifier so that when the input signal is passed through the resulting combination, the output of the power amplifier is similar to that of an ideal amplifier. The predistortion module, in effect, has characteristics that reduce the nonlinear and memory effects of the power amplifier. Predistortion is performed separately on the amplitude and the phase components of the input signal. Further, predistortion is of two kinds: memory-based predistortion and memoryless predistortion. Memory-based predistortion reduces both the memoryless and memory effects in the output of the power amplifier. Memoryless predistortion, on the other hand, reduces only the memoryless effects introduced by the power amplifier.

To compute models to predistort the input signal, AM/AM and AM/PM characteristics are determined by measuring the output signal of the power amplifier and converting this signal to baseband. The AM/AM characteristics represent amplitude dependent gain and the AM/PM characteristics represent amplitude dependent phase shift. The baseband values are then used to derive the AM/AM and AM/PM characteristics in conjunction with the input signal. The determined characteristics are then modeled using a Tapped Delay Line (TDL) model for the power amplifier.

The method disclosed by the present invention performs predistortion as follows. First, the memory effects introduced in the amplitude of the output signal due to the power amplifier are modeled and the output of this model is subtracted from the input signal to get an amplitude memory-subtracted signal. Memoryless amplitude predistortion is performed on this amplitude memory-subtracted signal by passing the signal through the inverse model of the memoryless amplitude effects. Once the amplitude memory effects have been subtracted and predistortion for memoryless amplitude effects has been performed, memory-based phase predistortion is carried out. Memory-based phase predistortion is carried out by passing an amplitude-predistorted signal through an inverse model of both the memory and memoryless effects in the phase. Thereafter, a phase-predistorted signal is predistorted using an input correction filter. The input correction filter reduces the computational complexity of memory-based models.

In general, a power amplifier can consist of one or more amplifiers that are cascaded together. For the present invention, the power amplifier is modeled by isolating the linear and nonlinear effects introduced in the input signal. This is done by first determining the linear response of the power amplifier. The linear response of the power amplifier is determined based on the input and output of the power amplifier. Thereafter, the linear characteristics are used to model the input correction filter. The linear characteristics can be based on the power amplifier measurements with the power amplifier operating at full power, or, for greater accuracy, at a reduced power.

The input correction filter model is also used to predistort the signal before the power amplifier amplifies it. The input correction filter predistorts the signal to remove the linear effects that are a function of the frequency of the input signal.

Further, the models used for predistortion are updated to account for the variations in the characteristics of the power amplifier. These variations, occurring due to external factors such as temperature and time, are determined by comparing the output signal of the power amplifier with the input signal. These determined variations are used to update the various models being used for predistortion.

FIG. 1 is a block diagram illustrating an environment in which the present invention operates. A Digital Signal Generator 101 generates digital signals to be amplified by a Power Amplifier 103. Digital Signal Generator 101 represents any electronic circuit generating a digital signal that needs amplification before transmission. Some examples of digital signals are IS95, W-CDMA, CDMA 2000 and OFDM signals. The digital signal is predistorted using a Predistortion System 105. The predistorted digital signal is converted to an analog signal by a Digital to Analog Converter 107. A Frequency Up Converter 109 up-converts frequency of the analog signal from baseband to carrier frequency. Thereafter, Power Amplifier 103 amplifies this up-converted analog signal. To measure the effects introduced by Power Amplifier 103, the output of Power Amplifier 103 is attenuated by means of a Coupler 111 and then down-converted by a Frequency Down Converter 113. Down-conversion involves reducing frequency of the output signal to baseband frequency. This down-converted analog signal is converted to a digital signal by an Analog to Digital Converter 115. A Predistortion Parameter Analyzer 117 calculates and updates the models being used for predistortion of the input signal using this down-converted and digitized signal (output of Analog to Digital Converter 115), and the input signal.

Figure 2:
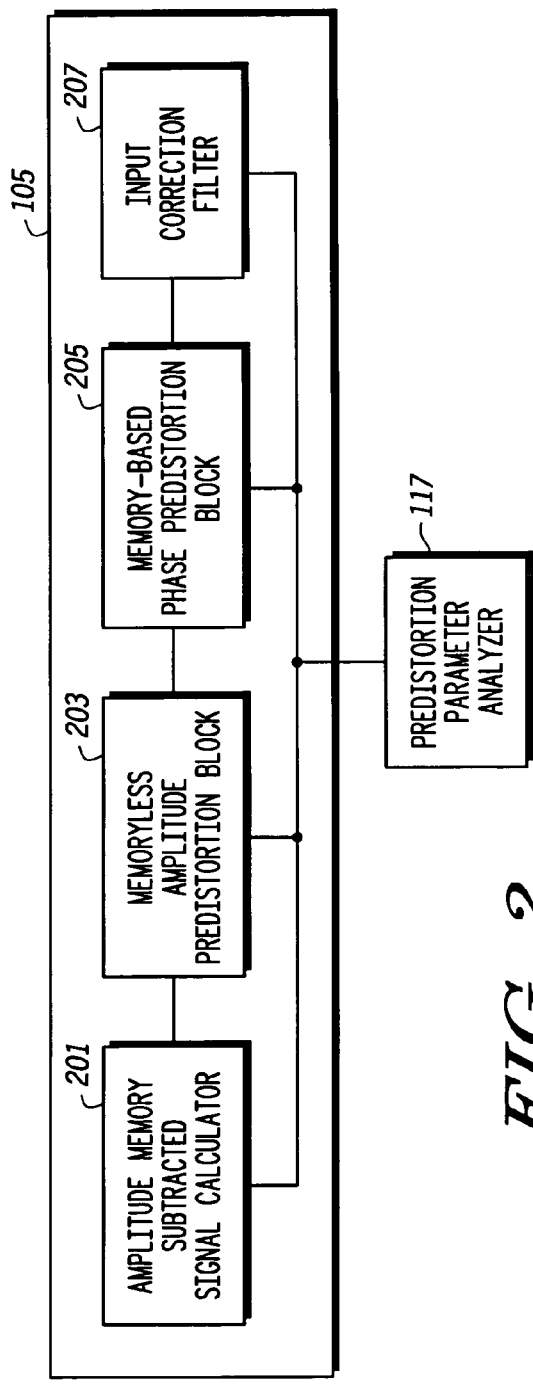
FIG. 2 is a block diagram illustrating the system elements implementing memory-based predistortion according to an embodiment of the invention.

FIG. 2 is a block diagram illustrating system elements implementing memory-based predistortion according to an embodiment of the invention (illustrating Predistortion System 105 shown in FIG. 1). Predistortion Parameter Analyzer 117 dynamically determines the AM/AM and AM/PM characteristics of Power Amplifier 103 by measuring the output signal and comparing it to the input signal. These characteristics are used to compute a memoryless AM/AM model, a memory-based AM/AM model, a memoryless amplitude predistortion model, a memory-based AM/PM model, and a memory-based phase predistortion model. The input correction filter model is determined using the known input signal and measured output signal. These models are used by Predistortion System 105 to predistort a signal before it is passed through Power Amplifier 103. Predistortion System 105 comprises an Amplitude Memory Subtracted Signal Calculator 201, a Memoryless Amplitude Predistortion Block 203, a Memory-based Phase Predistortion Block 205 and an Input Correction Filter 207. The input signal when passed through Amplitude Memory Subtracted Signal Calculator 201 gives an amplitude memory-subtracted signal as its output. Amplitude Memory Subtracted Signal Calculator 201 is explained in details later in the description. Memoryless Amplitude Predistortion Block 203 implements the memoryless amplitude predistortion model. The amplitude memory-subtracted signal when passed through Memoryless Amplitude Predistortion Block 203 gives the amplitude-predistorted signal. The amplitude-predistorted signal is then passed through Memory-based Phase Predistortion Block 205. Memory-based Phase Predistortion Block 205 implements the memory-based phase predistortion model. The amplitude-predistorted signal when passed through Memory-based Phase Predistortion Block 205 gives the phase-predistorted signal. Finally, Input Correction Filter 207 implements the input correction filter model and predistorts the phase-predistorted signal.

Figure 3:
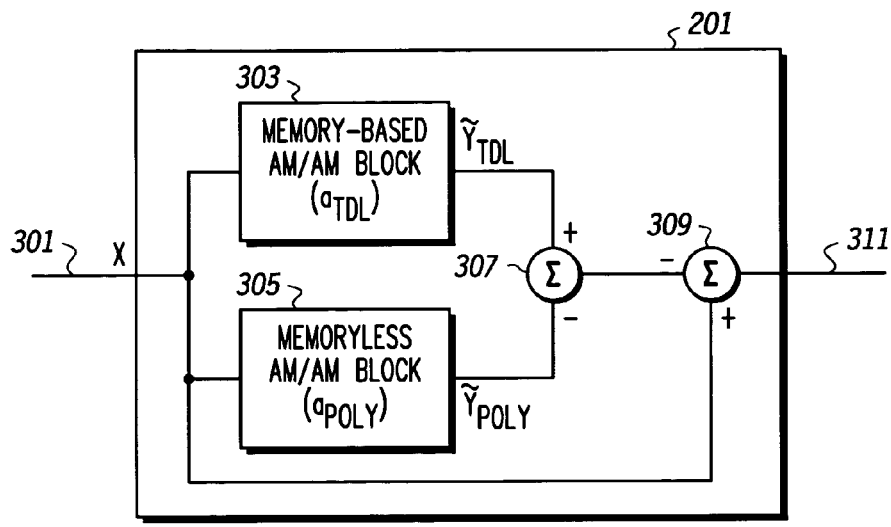
FIG. 3 is a block diagram illustrating the system elements in amplitude memory subtracted signal calculator.

FIG. 3 is a block diagram illustrating the system elements in Amplitude Memory Subtracted Signal Calculator 201. Amplitude Memory Subtracted Signal Calculator 201 computes an amplitude memory signal for Power Amplifier 103, wherein the amplitude memory signal represents the memory effects introduced in the amplitude by Power Amplifier 103. The input signal coming from a connection means 301 is passed through a Memory-based AM/AM Block 303 and a Memoryless AM/AM Block 305. Output of Memory-based AM/AM Block 303 is a signal with the amplitude altered such that it represents the amplitude of a signal output from Power Amplifier 103. Therefore, both memory and memoryless effects distort the amplitude of this signal. On the other hand, output of Memoryless AM/AM Block 305 emulates the amplitude of the signal taking into account only the memoryless amplitude effects introduced by Power Amplifier 103. For both Memory-based AM/AM Block 303 and Memoryless AM/AM Block 305, the gain of Power Amplifier 103 in the linear region is removed from the models. A Subtracting Module 307 subtracts the output of Memoryless AM/AM Block 305 from the output of Memory-based AM/AM Block 303. Output of Subtracting Module 307 simulates only the memory effects in the amplitude introduced in a signal by Power Amplifier 103. A Subtracting Module 309 subtracts this amplitude memory signal from the input signal, coming from connection means 301. Output of Subtracting Module 309 is the amplitude memory-subtracted signal at a connection means 311.

Figure 4:
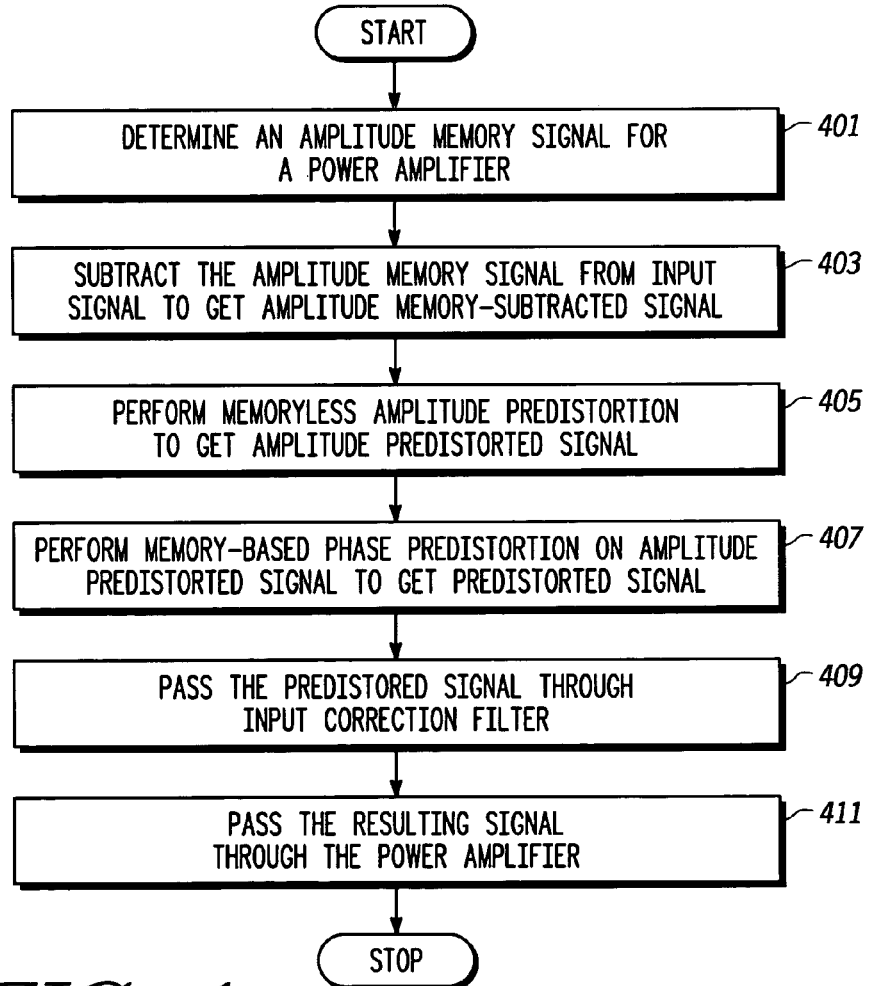
FIG. 4 is a flowchart illustrating a method for memory-based predistortion according to an embodiment of the invention.

FIG. 4 is a flowchart illustrating a method for memory-based predistortion according to an embodiment of the invention. At step 401, the amplitude memory signal of Power Amplifier 103 is determined. The amplitude memory signal represents the amplitude memory effects. At step 403, the amplitude memory signal is subtracted from the input signal to get the amplitude memory-subtracted signal. At step 405, memoryless amplitude predistortion is performed on the amplitude memory-subtracted signal to get the amplitude-predistorted signal. Memoryless amplitude predistortion reduces the memoryless effects introduced in the amplitude of the signal by Power Amplifier 103. At step 407 memory-based phase predistortion is performed on the amplitude-predistorted signal. Memory-based phase predistortion reduces both the memoryless and memory effects introduced in the phase of the output signal. At step 409, the output of memory-based phase predistortion model is passed through Input Correction Filter 207. Input Correction Filter 207 carries out predistortion of the phase-predistorted signal resulting from step 407 to reduce the memory effects in the linear response of Power Amplifier 103. The method for determination of Input Correction Filter 207 is described later. This predistorted signal, when passed through Power Amplifier 103 at step 411, has reduced memory and memoryless effects. This process is repeated for every input sample on a continuous basis.

Figure 5A:
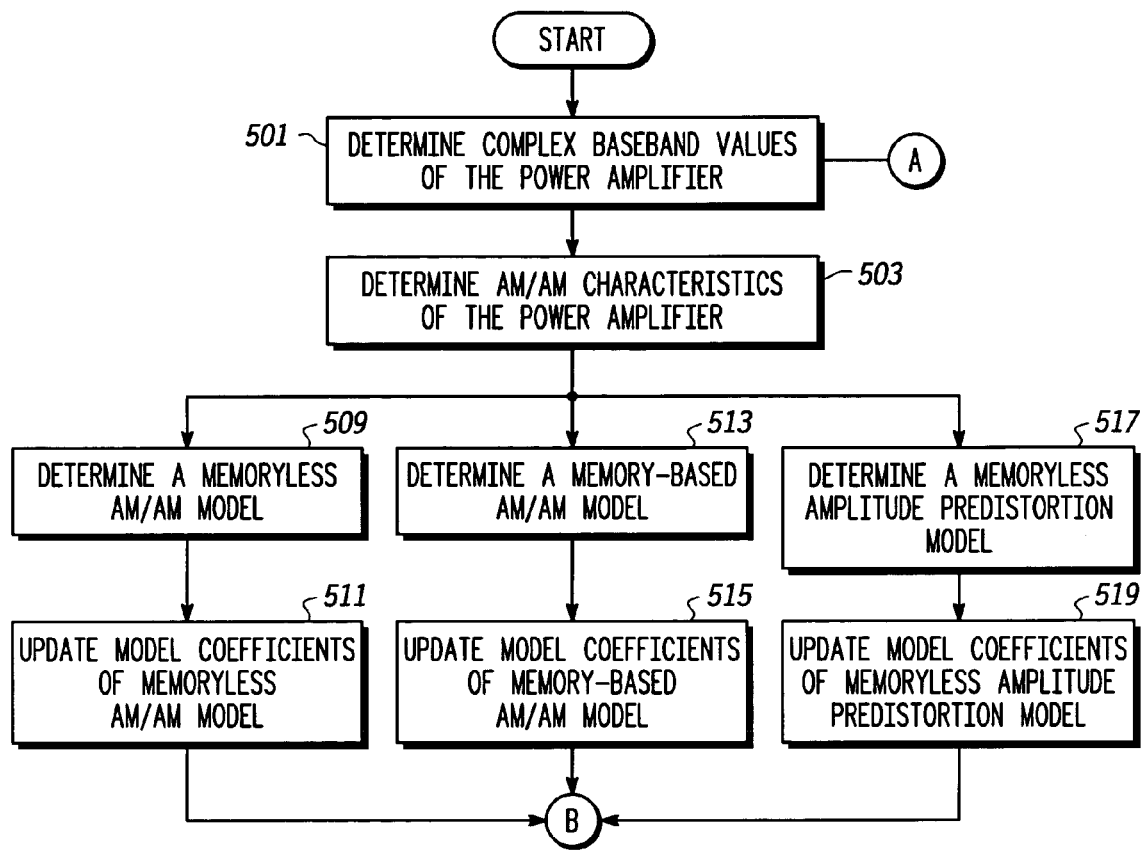
FIG. 5a and FIG. 5b form a flowchart illustrating a method for determining and updating the models implemented by a predistortion parameter analyzer for the power amplifier.
Figure 5B:
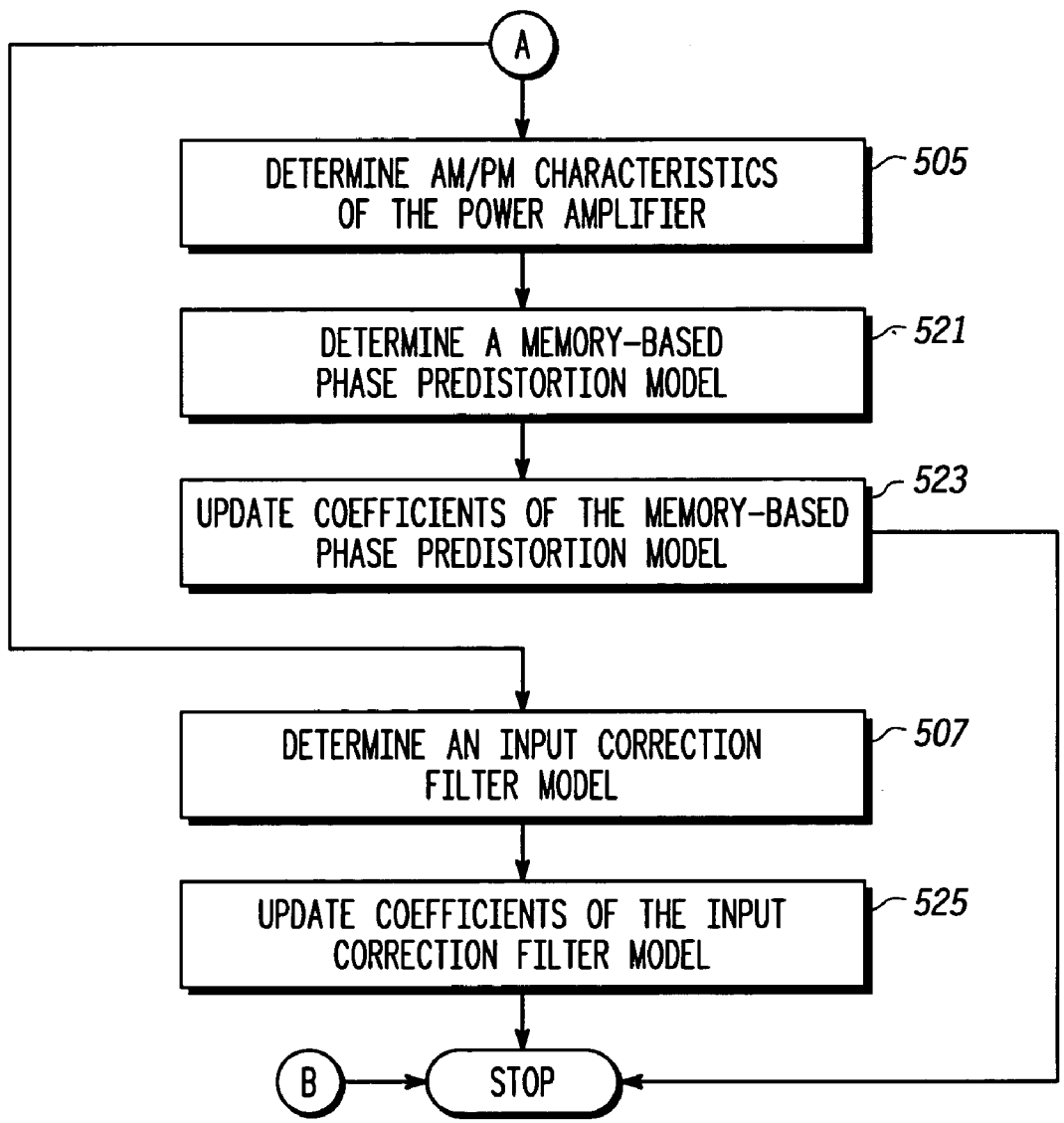
Figure 6:
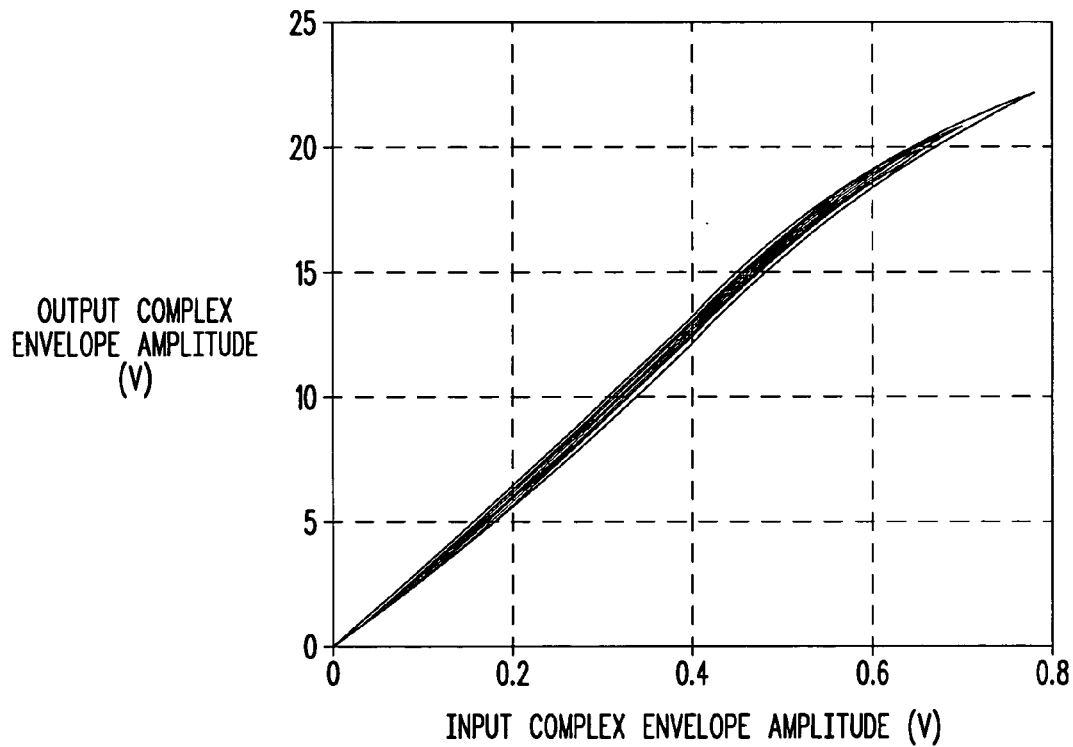
FIG. 6 is a plot illustrating determined AM/AM characteristics of a power amplifier.

FIG. 5a and FIG. 5b form a flowchart illustrating a method for determining and updating the models implemented by the predistortion parameter analyzer for the power amplifier. At step 501, complex baseband values for the power amplifier are determined by using the input and the output signals. These complex baseband values are in turn used to determine the AM/AM characteristics, the AM/PM characteristics and the input correction filter model for Power Amplifier 103 at steps 503, 505 and 507, respectively. The process of deriving the AM/AM characteristics and the AM/PM characteristics from complex baseband values is provided in a research paper entitled "W-CDMA Power Amplifier Modeling" by Sean McBeath, Danny Pinckley, and J. R. Cruz published in Proc. IEEE Veh. Technol. Conf., 2001, pp 2243–2247. FIG. 6 shows the determined AM/AM characteristics of Power Amplifier 103. The details for determination of the input correction filter model are given later in the description.

At step 509, a memoryless AM/AM model is determined using the AM/AM characteristics obtained at step 503. The memoryless AM/AM model models the memoryless effects introduced in the amplitude of the output signal of Power Amplifier 103. The AM/AM characteristics are modeled using a polynomial model. The polynomial model is a simplified version of the TDL model. The TDL model can be used to model both memory and memoryless effects. The polynomial model, however, can model only the memoryless effects. The TDL model is described below.

It should be noted here that the TDL model is an exemplary method for determining the memoryless AM/AM model. It is obvious to a person skilled in the art that other methods for determining the memoryless AM/AM model can also be used. One such example is a spline-based model.

TDL Model

The TDL model represents the current output by a summation of polynomials of the current and prior inputs. Mathematically, the modeled output is given by:

$$\tilde{y}(n) = \sum_{m=0}^{ml} \sum_{p=0}^{po-1} a_{m,p} x^{po-p}(n-m) + a_{ml+1,po} \qquad \text{Equation 1}$$

where,
1. $\tilde{y}(n)$ is the modeled output,
2. $x(n)$ is the measured input,
3. ml is the memory length,
4. po is the order of the polynomials, and
5. $a_i$ is the ith model coefficient.

A specific instance of the TDL model is referred to as [po,ml]. When po and ml are small, the TDL model can be written out fully. For example, using the [2,1] TDL model, Equation 1 is written as, $$\tilde{y}(n) = a_{0,0} x^2(n) + a_{0,1} x(n) + a_{1,0} x^2(n-1) + a_{1,1} x(n-1) + a_{2,2} \qquad \text{Equation 2}$$

For this case of the power amplifier, the TDL model fits the determined AM/AM characteristics to a second order polynomial of the current sample and a second order polynomial of the previous sample plus a shared constant term.

The TDL model coefficients are found using the classical least-squares technique. The least-squares technique uses an information matrix 'X', whose columns correspond to the terms of the model. For example, the information matrix for the [2,1] TDL model discussed previously is, $$X = \begin{bmatrix} x^2(0) & x(0) & x^2(N-1) & x(N-1) & 1 \\ x^2(1) & x(1) & x^2(0) & x(0) & 1 \\ \vdots & \vdots & x^2(1) & x(1) & 1 \\ x^2(N-2) & x(N-2) & \vdots & \vdots & \vdots \\ x^2(N-1) & x(N-1) & x^2(N-2) & x(N-2) & 1 \end{bmatrix} \qquad \text{Equation 3}$$

The coefficients for the TDL model are found by minimizing the squared error between the modeled and measured outputs. Consider $$Xa = y + e \qquad \text{Equation 4}$$

where,
1. X is the information matrix described in Equation 3
2. y is a column vector corresponding to the measured output y(n)
3. e is the column vector of errors
4. a is the vector of TDL model coefficients The squared error is defined as, $$E = e^T e \qquad \text{Equation 5}$$

Equation 5 after substitution and simplification from Equations 3 and 4 gives, $$E = a^T X^T X a - 2 a^T X^T y + y^T y \qquad \text{Equation 6}$$

Squared error E can be minimized by setting the derivative of Equation 6 with respect to vector a equal to zero as follows:

$$\frac{\partial E}{\partial a} = 0 = 2X^T X a - 2X^T y \qquad \text{Equation 7}$$

Equation 7 gives the following least squares solution, $$a = (X^T X)^{-1} X^T y \qquad \text{Equation 8}$$

Using the least-squares solution from Equation 8, the modeled output of Power Amplifier 103 is, $$\tilde{y} = Xa \qquad \text{Equation 9}$$

where $\tilde{y}$ is the column vector corresponding to $\tilde{y}(n)$. The mean-squared-error (mse) is defined as, $$mse = \text{mean}((\tilde{y}(n) - y(n))^2) \qquad \text{Equation 10}$$

The calculations for Equation 1 to Equation 10 are performed by Predistortion Parameter Analyzer 117.

The polynomial model is obtained from the above equations by substituting the memory length ml of the TDL model by zero. The vector 'a', found using such a TDL model, divided by the gain of Power Amplifier 103 in linear region gives a vector 'c'. The vector 'c' gives the memoryless AM/AM model for the case when ml is zero.

The memoryless AM/AM model, as determined above, is implemented by Memoryless AM/AM Block 305. At step 511, the coefficients of the memoryless AM/AM model are updated at a predetermined rate. The rate is usually much smaller than the rate at which the input signals are predistorted. For example, if the input signals are being predistorted at a rate of the order of one signal sample per nanosecond, the models may be updated at a rate of the order of milliseconds. The coefficients are modeled and updated by Predistortion Parameter Analyzer 117.

Referring to FIG. 3, Memoryless AM/AM Block 305 implements the polynomial model as determined by Equation 8 with ml=0. This model is represented as $a_{POLY}$. Input signal 'x' when passed through Memoryless AM/AM Block 305 gives an output $\tilde{y}_{POLY}$. This is again obtained as per Equation 1, where ml is zero.

Figure 7:
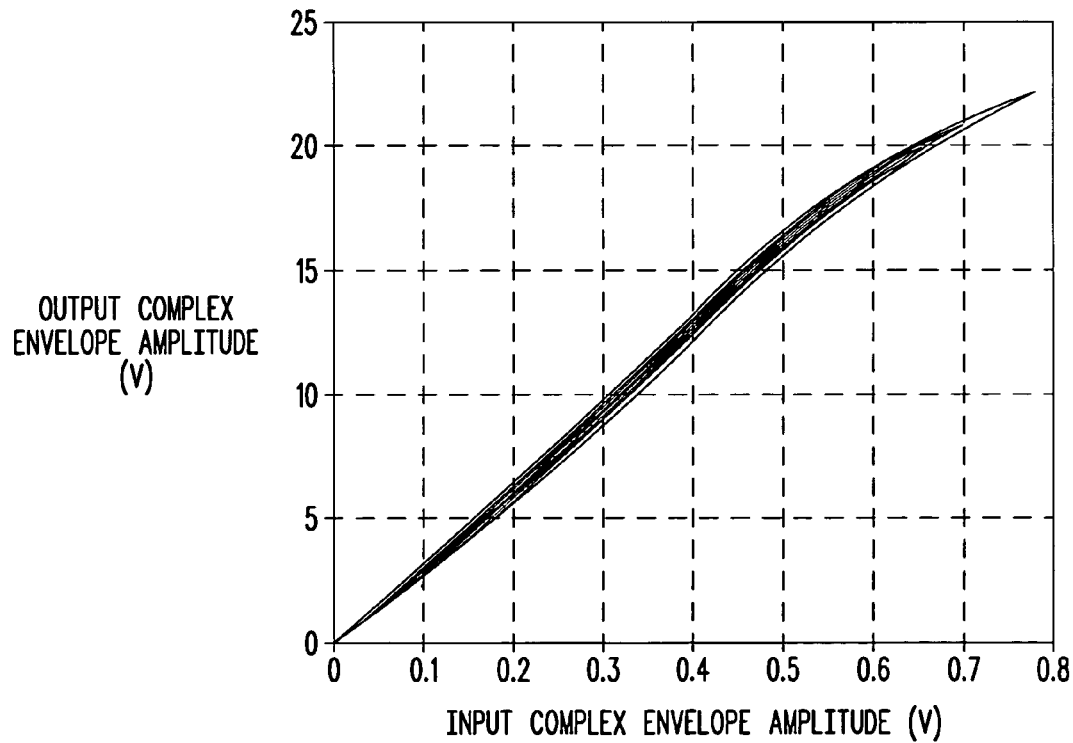
FIG. 7 is a plot illustrating a graph of memory-based AM/AM characteristics modeled using the TDL model.

At step 513, a memory-based AM/AM model is modeled using the AM/AM characteristics of Power Amplifier 103, determined at step 503. The memory-based AM/AM model models both the memoryless and memory effects in the amplitude of the output signal of Power Amplifier 103. The memory-based AM/AM model is modeled using the TDL model as described above. This is for the case when the memory length ml, as mentioned in the description of the TDL model, is not zero. FIG. 7 shows a plot of memory-based AM/AM characteristics modeled using the TDL model. The memory-based model is implemented by Memory-based AM/AM Block 303. At step 515, the memory-based AM/AM model is updated at a predetermined rate. The coefficients are modeled and updated by Predistortion Parameter Analyzer 117.

It should be noted here that the TDL model is an exemplary method for determining the memory-based AM/AM model. It is obvious to a person skilled in the art that other methods for determining the memory-based AM/AM model can also be used. One such example is a multivariate spline-based model.

Referring back to FIG. 3, Memory-based AM/AM Block 303 implements the TDL model as determined by Equation 8. The TDL model for this case is represented as $a_{TDL}$. This is the case when ml is an integer greater than zero. Input signal 'x' when passed through Memory-based AM/AM Block 303 gives an output $\tilde{y}_{TDL}$. This is obtained as per Equation 1.

At step 517, a memoryless amplitude predistortion model is determined using the AM/AM characteristics obtained in step 503. The polynomial model is used to model the memoryless amplitude predistortion model. The polynomial model is set up using abovementioned Equation 4 as follows. The information matrix (X) is based on the normalized output of Power Amplifier 103 and y is based on the input of Power Amplifier 103. In other words, the roles of input and output are reversed, so an inverse model can be derived. The information matrix (X) refers to the information matrix of the measured complex baseband values divided by the gain of Power Amplifier 103 in the linear region. The polynomial model is used to obtain the memoryless amplitude predistortion model as described above. However, it is obvious to a person skilled in the art that any other memoryless model can also be used for the same purpose. Finally, at step 519, the memoryless amplitude predistortion model is updated at a predetermined rate.

Figure 8:
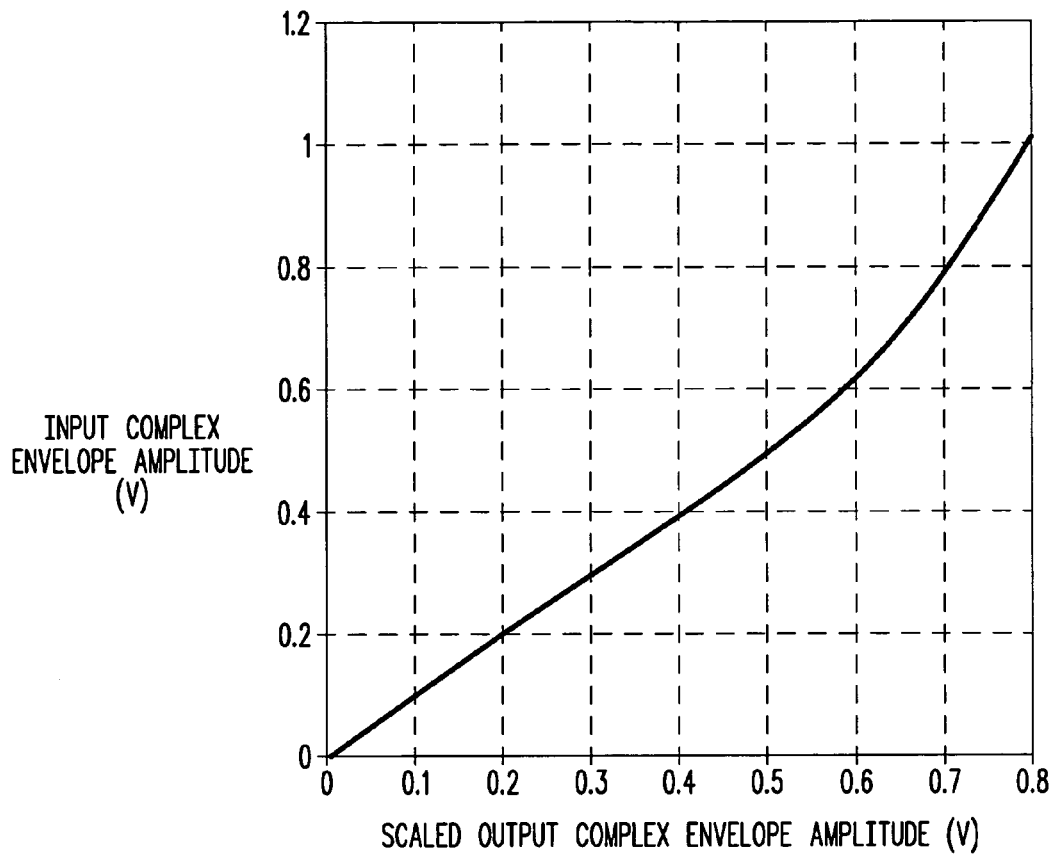
FIG. 8 illustrates a plot of a fifth order polynomial memoryless amplitude predistortion function.

FIG. 8 shows a memoryless amplitude predistortion function that is a fifth order polynomial. Here x-axis values represent the desired output amplitude and the y-axis values represent the required input amplitude.

Figure 9:
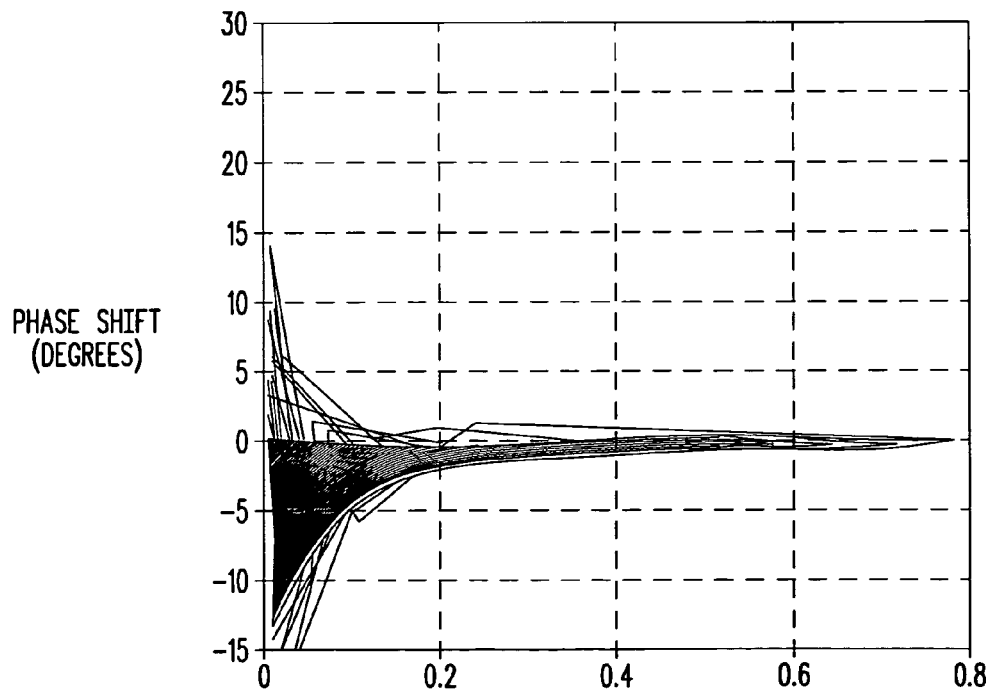
FIG. 9 illustrates a plot of the determined AM/PM characteristics for a power amplifier.
Figure 10:
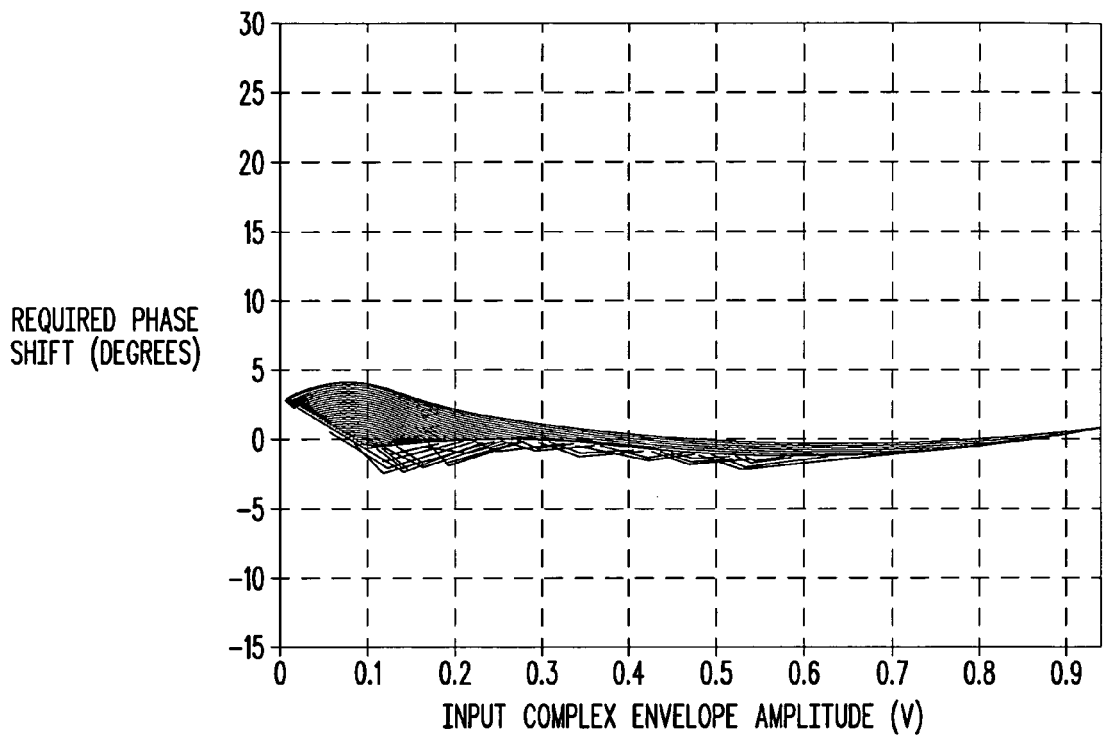
FIG. 10 illustrates a plot of the memory-based phase predistortion model.

As mentioned earlier, the AM/PM characteristics of Power Amplifier 103 are determined at step 505. FIG. 9 illustrates a plot of the determined AM/PM characteristics for Power Amplifier 103. These values are used to determine the memory-based phase predistortion model, as in step 521. The memory-based phase predistortion model compensates for both the memoryless and memory effects in the phase of the output signal of Power Amplifier 103. The memory-based phase predistortion model is implemented using the TDL model, as described earlier. FIG. 10 illustrates a plot of the memory-based phase predistortion model.

The TDL model is an exemplary method for determining the memory-based phase predistortion model. It is obvious to a person skilled in the art that other methods for determining the memory-based phase predistortion model can also be used.

The process of deriving the input correction filter model, at step 507, is described in detail below.

Input Correction Filter

Let x(n) be a predistorted input to Power Amplifier 103 and $y_1(n)$ be the output of the power amplifier. Here, x(n) and $y_1(n)$ are complex baseband values. Various methods exist in the prior art that describe how complex baseband values are obtained from Power Amplifier 103. An exemplary method for measuring the complex baseband values is described in the research paper entitled "W-CDMA Power Amplifier Modeling" by Sean McBeath, Danny Pinckley, and J. R. Cruz published in Proc. IEEE Veh. Technol. Conf., 2001, pp 2243–2247. To find the input correction filter model, the inverse of the input linear filter model between x(n) and $y_1(n)$ needs to be evaluated. To do this, the least-squares solution between $y_1(n)$ and x(n) is found. The least-squares solution is found by minimizing the squared error, as described below.

Consider the linear model of Power Amplifier 103 to be, $$Y_1 a = x + e \qquad \text{Equation 11}$$

where,

1. $Y_1$ is an information matrix for output of Power Amplifier 103 (each column is a delayed version of the previous column), $$Y_1 = \begin{bmatrix} y_1(0) & y_1(-1) & \cdots & y_1(-F+1) \\ y_1(1) & y_1(0) & \cdots & \vdots \\ y_1(2) & y_1(1) & \cdots & \vdots \\ y_1(3) & y_1(2) & \cdots & y_1(0) \\ \vdots & \vdots & \ddots & \vdots \\ y_1(N-1) & y_1(N-2) & \cdots & y_1(N-F) \end{bmatrix} \qquad \text{Equation 12}$$

Here, F is the length of a finite-impulse-response (FIR) filter implemented by Input Correction Filter 207.

2. x is a column vector corresponding to the measured input x(n), 3. e is a column vector for errors, 4. a is the vector of FIR filter coefficients for the input correction filter model.

The squared error E is given by, $$E = e^H e \qquad \text{Equation 13}$$

The squared error E after substitution and simplification using Equation 11 is given by, $$E = a^H Y_1^H Y_1 a - 2a^H Y_1^H x + x^H x \qquad \text{Equation 14}$$

The squared error is minimized by setting the derivative of Equation 14 to zero as follows.

$$\frac{\partial E}{\partial a} = 0 = 2Y_1^H Y_1 a - 2Y_1^H x \quad \text{Equation 15}$$

Equation 15 gives the following least-squares solution, $$a = (Y_1^H Y_1)^{-1} Y_1^H x \quad \text{Equation 16}$$

In Equation 16, 'a' represents Finite Impulse Response (FIR) filter coefficients that model Input Correction Filter 207. Equation 16 is scaled such that the gain of Power Amplifier 103 is removed from the input correction filter model. In the above equations, H represents the Hermitian transpose. Predistortion Parameter Analyzer 117 calculates Equation 16.

At step 525, the coefficients of the input correction filter model are updated by Predistortion Parameter Analyzer 117.

Input Correction Filter 207 is implemented in hardware as an FIR filter as a custom made Integrated Circuit (IC) the details of which are well known to a person skilled in the art. In another embodiment, an Infinite Impulse Response (IIR) filter can also be used in the disclosed invention to implement Input Correction Filter 207.

Figure 11:
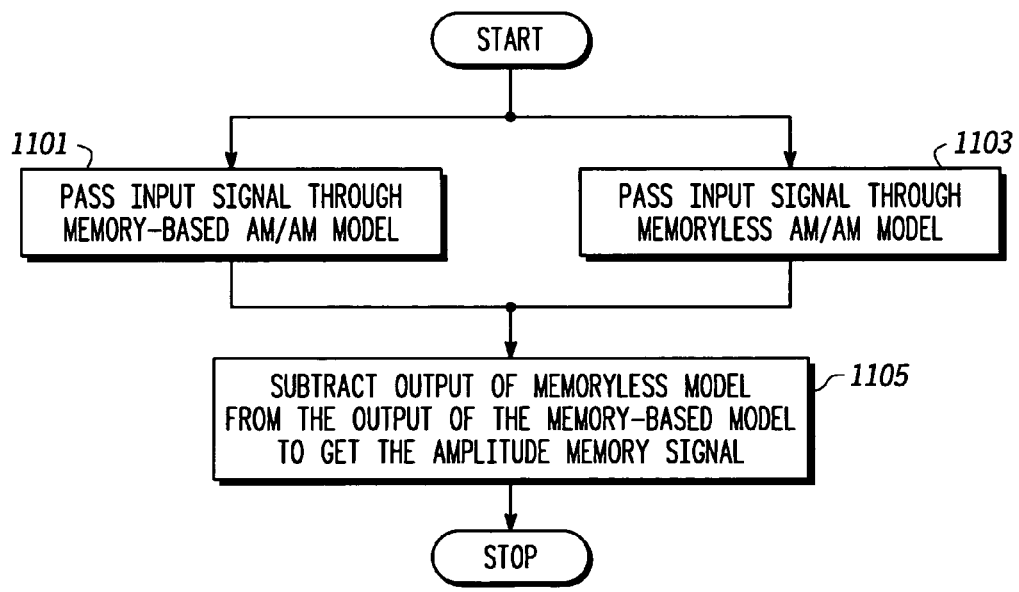
FIG. 11 is a flowchart illustrating a method for determination of amplitude memory signal.

FIG. 11 is a flowchart illustrating a method for determination of the amplitude memory signal. The input signal is passed through Memoryless AM/AM Block 305 and Memory-based AM/AM Block 303 simultaneously at steps 1103 and 1101 respectively. At step 1105, the output obtained at step 1103 is subtracted from the output obtained at step 1101. The output obtained at step 1105 gives the amplitude memory signal. Referring to FIG. 3, the amplitude memory signal is obtained by subtracting $\tilde{y}_{POLY}$ from $\tilde{y}_{TDL}$.

Memory-based AM/AM Block 303 and Memoryless AM/AM Block 305 can be implemented using a custom made IC. Memory-based Phase Predistortion Block 205 can be implemented in hardware using a custom made IC. Predistortion Parameter Analyzer 117 can be implemented in hardware using a Digital Signal Processor (DSP) that has its own Random Access Memory (RAM). Examples of DSPs are well known in the art. Implementations of Digital to Analog Converter 107, Frequency Up Converter 109, Frequency Down Converter 113 and Analog to Digital Converter 115 are well known in the prior art. As an example AD9772A, 14 bit, 160 mega samples per second, manufactured by Analog Devices, Inc., NH, USA can be used for Digital to Analog Converter 107. Further, AD6645, 14 bit, 105 mega samples per second, manufactured by Analog Devices, Inc., NH, USA can be used for Analog to Digital Converter 115.

In another embodiment, Predistortion System 105 comprises Amplitude Memory Subtracted Signal Calculator 201, Memoryless Amplitude Predistortion Block 203 and Memory-based Phase Predistortion Block 205. The method for predistortion and determination of these blocks is the same as described earlier.

In another embodiment, Predistortion System 105 comprises Amplitude Memory Subtracted Signal Calculator 201 and Memoryless Amplitude Predistortion Block 203. The method for predistortion and determination of these blocks is the same as described earlier.

The present invention has several advantages, as mentioned below.

First, it takes into account both the memoryless and memory effects introduced by the power amplifier for performing predistortion. Second, the invention updates the models used for predistortion to take into account the variations in the characteristics of the power amplifier. Variations in characteristics occur with time due to changes in external conditions such as temperature. Third, the invention eliminates the need to directly compute a memory-based AM/AM predistortion model to perform amplitude predistortion thereby becoming computationally efficient. Finally, the use of the Input Correction Filter helps reduce the computational complexity of the predistortion process.

While the various embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method for reducing memoryless and memory effects in the amplitude and the phase of an output signal of a power amplifier, the output signal obtained by predistorting an input signal to get a predistorted signal and passing the predistorted signal through the power amplifier, the method comprising:
   a. determining an amplitude memory signal using a memory-based AM/AM model and a memoryless AM/AM model, the amplitude memory signal representing the memory effects in the amplitude of the output signal;
   b. subtracting the amplitude memory signal from the input signal to get an amplitude memory-subtracted signal;
   c. performing memoryless amplitude predistortion on the amplitude memory-subtracted signal using a memoryless amplitude predistortion model to get an amplitude-predistorted signal, the memoryless amplitude predistortion being performed to reduce the memoryless effects in the amplitude of the output signal; and
   d. performing memory-based phase predistortion on the amplitude-predistorted signal using a memory-based phase predistortion model to get a phase predistorted signal, the memory-based phase predistortion being performed to reduce the memoryless and memory effects in the phase of the output signal.

2. The method as recited in claim 1 wherein the method for reducing the memoryless and memory effects further comprises:
   a. determining an input correction filter model, the input correction filter model modeling the inverse of the linear response of the power amplifier; and
   b. applying the input correction filter model to the phase predistorted signal.

3. The method as recited in claim 2 wherein determining the input correction filter model is performed at a predetermined rate.

4. The method as recited in claim 2 wherein determining the input correction filter model comprises the steps of:
   a. determining complex baseband values of the power amplifier by measuring the output signal and the input signal; and
   b. determining the input correction filter model using the determined complex baseband values.

5. The method as recited in claim 1 wherein the method for reducing the memoryless and memory effects further comprises:
   a. determining complex baseband values of the power amplifier by measuring the output signal and the input signal;
   b. determining AM/AM characteristics of the power amplifier based on the complex baseband values;
   c. determining AM/PM characteristics of the power amplifier based on the complex baseband values;
   d. determining the memory-based AM/AM model, the memory-based AM/AM model representing both the memoryless effects and the memory effects in the amplitude of the output signal;
   e. determining the memoryless AM/AM model, the memoryless AM/AM model representing the memoryless effects in the amplitude of the output signal;
   f. determining the memoryless amplitude predistortion model, the memoryless amplitude predistortion model performing memoryless amplitude predistortion; and
   g. determining the memory-based phase predistortion model, the memory-based phase predistortion model performing memory-based phase predistortion.

6. The method as recited in claim 5 wherein steps a to g are performed at a predetermined rate to update the memory-based AM/AM model, the memoryless AM/AM model, the memoryless amplitude predistortion model and the memory-based phase predistortion model.

7. The method as recited in claim 5 wherein the memoryless AM/AM model is modeled using a polynomial model.

8. The method as recited in claim 5 wherein the memory-based AM/AM model is modeled using a TDL model.

9. The method as recited in claim 5 wherein the memoryless amplitude predistortion model is modeled using a polynomial model.

10. The method as recited in claim 5 wherein the memory-based phase predistortion model is modeled using a TDL model.

11. The method as recited in claim 1 wherein determining the amplitude memory signal comprises:
   a. passing the input signal simultaneously through the memory-based AM/AM model and the memoryless AM/AM model; and
   b. subtracting the output of the memoryless AM/AM model from the output of the memory-based AM/AM model.

12. A method for reducing the memoryless and memory effects in the amplitude and the phase of an output signal of a power amplifier, the output signal obtained by predistorting an input signal to get a predistorted signal and passing the predistorted signal through the power amplifier, the method comprising:
   a. determining an amplitude memory signal using a memory-based AM/AM model and a memoryless AM/AM model, the amplitude memory signal representing the memory effects in the amplitude of the output signal;
   b. subtracting the amplitude memory signal from the input signal to get an amplitude memory-subtracted signal; and
   c. performing memoryless amplitude predistortion on the amplitude memory-subtracted signal using a memoryless amplitude predistortion model to get an amplitude-predistorted signal, the memoryless amplitude predistortion being performed to reduce the memoryless effects in the amplitude of the output signal.

13. The method as recited in claim 12 wherein the method for reducing the memoryless and memory effects further comprises:
   a. determining an input correction filter model, the input correction filter model modeling the inverse of the linear response of the power amplifier; and
   b. applying the input correction filter model to the amplitude-predistorted signal, the input correction filter model representing the inverse of the linear response of the power amplifier.

14. The method as recited in claim 13 wherein determining the input correction filter model comprises the steps of:
   a. determining complex baseband values of the power amplifier by measuring the output signal and the input signal; and
   b. determining the input correction filter model using the determined complex baseband values.

15. The method as recited in claim 13 wherein determining the input correction filter model is performed at a predetermined rate.

16. The method as recited in claim 12 wherein the method for reducing memoryless and memory effects further comprises:
   a. determining complex baseband values of the power amplifier by measuring the output signal and the input signal;
   b. determining AM/AM characteristics of the power amplifier based on the complex baseband values;
   c. determining the memory-based AM/AM model, the memory-based AM/AM model representing the memoryless effects and the memory effects in the amplitude of the output signal;
   d. determining the memoryless AM/AM model, the memoryless AM/AM model representing the memoryless effects in the amplitude of the output signal; and
   e. determining the memoryless amplitude predistortion model, the memoryless amplitude predistortion model performing memoryless amplitude predistortion.

17. The method as recited in claim 16 wherein steps a to e are performed at a predetermined rate to update the memory-based AM/AM model, the memoryless AM/AM model and the memoryless amplitude predistortion model.

18. The method as recited in claim 12 wherein determining the amplitude memory signal comprises:
   a. passing the input signal simultaneously through the memory-based AM/AM model and the memoryless AM/AM model; and
   b. subtracting output of the memoryless AM/AM model from output of the memory-based AM/AM model.

19. A method for reducing the memoryless and memory effects in the amplitude and the phase of an output signal of a power amplifier, the output signal obtained by predistorting an input signal to get a predistorted signal and passing the predistorted signal through the power amplifier, the method comprising:
   a. determining an amplitude memory signal using a memory-based AM/AM model and a memoryless AM/AM model, the amplitude memory signal representing the memory effects in the amplitude of the output signal;
   b. subtracting the amplitude memory signal from the input signal to get an amplitude memory-subtracted signal;
   c. performing memoryless amplitude predistortion on the amplitude memory-subtracted signal using a memoryless amplitude predistortion model to get an amplitude-predistorted signal, the memoryless amplitude predistortion being performed to reduce the memoryless effects in the amplitude of the output signal;

d. performing memory-based phase predistortion on the amplitude-predistorted signal using a memory-based phase predistortion model to get a phase predistorted signal, the memory-based phase predistortion being performed to reduce the memoryless and memory effects in the phase of the output signal; and e. applying an input correction filter model to the phase predistorted signal, the input correction filter model representing the inverse model of the linear response of the power amplifier.

20. The method as recited in claim 19 wherein the method for reducing the memoryless and memory effects further comprises:

a. determining complex baseband values of the power amplifier by measuring the output signal and the input signal;

b. determining AM/AM characteristics of the power amplifier based on the complex baseband values;

c. determining AM/PM characteristics of the power amplifier based on the complex baseband values;

d. determining the memory-based AM/AM model, the memory-based AM/AM model representing the memoryless effects and the memory effects in the amplitude of the output signal;

e. determining the memoryless AM/AM model, the memoryless AM/AM model introducing the memoryless effects in the amplitude of the output signal;

f. determining the memoryless amplitude predistortion model, the memoryless amplitude predistortion model performing memoryless amplitude predistortion; and g. determining the memory-based phase predistortion model, the memory-based phase predistortion model performing memory-based phase predistortion.

h. determining the input correction filter model, the input correction filter model modeling the inverse of the linear response of the power amplifier using the determined complex baseband values.

21. The method as recited in claim 20 wherein steps a to h are performed at a predetermined rate to update the memory-based AM/AM model, the memoryless AM/AM model, the memoryless amplitude predistortion model, the memory-based phase predistortion model, and the input correction filter model.

22. The method as recited in claim 19 wherein determining the amplitude memory signal comprises:

a. passing the input signal simultaneously through the memory-based AM/AM model and the memoryless AM/AM model; and b. subtracting output of the memoryless AM/AM model from output of the memory-based AM/AM model.

23. A system for reducing memoryless and memory effects in the amplitude and the phase of an output signal of a power amplifier, the output signal obtained by predistorting an input signal to get a predistorted signal and passing the predistorted signal through the power amplifier, the system comprising:

a. a predistortion parameter analyzer, the predistortion parameter analyzer determining the AM/AM characteristics of the power amplifier, the AM/PM characteristics of the power amplifier and computing models required for predistortion using the input signal and the output signal;

b. an amplitude memory subtracted signal calculator, the amplitude memory subtracted signal calculator determining an amplitude memory signal, the amplitude memory signal representing the memory effects in the amplitude of the output signal, and subtracting the amplitude memory signal from the input signal, the amplitude memory subtracted signal calculator comprising:

i. a memoryless AM/AM block, the memoryless AM/AM block representing the memoryless effects in the amplitude of the output signal;

ii. a memory-based AM/AM block, the memory-based AM/AM block representing the memoryless effects and the memory effects in the amplitude of the output signal;

iii. a first subtracting module, the first subtracting module subtracting the output of the memoryless AM/AM block from the output of the memory-based AM/AM block to obtain the amplitude memory signal; and iv. a second subtracting module, the second subtracting module subtracting the output of the first subtracting module from the input signal to obtain an amplitude memory subtracted signal;

c. a memoryless amplitude predistortion block, the memoryless amplitude predistortion block performing memoryless amplitude predistortion on the amplitude memory subtracted signal;

d. a memory-based phase predistortion block, the memory-based phase predistortion block performing memory-based phase predistortion on the output of the memoryless amplitude predistortion block; and e. an input correction filter, the input correction filter implementing the inverse model of the linear response of the power amplifier on the output of the memory-based phase predistortion block.

24. The system as recited in claim 23 wherein the predistortion parameter analyzer comprises:

a. a means for determining the memory-based AM/AM model modeling the memoryless effects and the memory effects in the amplitude of the output signal;

b. a means for determining the memoryless AM/AM model modeling the memoryless effects in the amplitude of the output signal;

c. a means for determining the memoryless amplitude predistortion model performing memoryless amplitude predistortion on the amplitude memory subtracted signal;

d. a means for determining a memory-based phase predistortion model performing memory-based phase predistortion on the output of the memoryless amplitude predistortion block; and e. a means for determining the input correction filter.

25. A system for reducing memoryless and memory effects in the amplitude and the phase of an output signal of a power amplifier, the output signal obtained by predistorting an input signal to get a predistorted signal and passing the predistorted signal through the power amplifier, the system comprising:

a. a predistortion parameter analyzer, the predistortion parameter analyzer determining the AM/AM characteristics of the power amplifier, the AM/PM characteristics of the power amplifier and computing models required for predistortion using the input signal and the output signal;

b. an amplitude memory subtracted signal calculator, the amplitude memory subtracted signal calculator determining an amplitude memory signal, the amplitude memory signal representing the memory effects in the amplitude of the output signal, and subtracting the amplitude memory signal from the input signal, the amplitude memory subtracted signal calculator comprising:
  i. a memoryless AM/AM block, the memoryless AM/AM block introducing the memoryless effects in the amplitude of the output signal;
  ii. a memory-based AM/AM block, the memory-based AM/AM block representing the memoryless effects and the memory effects in the amplitude of the output signal;
  iii. a first subtracting module, the first subtracting module subtracting the output of the memoryless AM/AM block from the output of the memory-based AM/AM block to obtain the amplitude memory signal; and
  iv. a second subtracting module, the second subtracting module subtracting the output of the first subtracting module from the input signal to obtain an amplitude memory subtracted signal;
c. a memoryless amplitude predistortion block, the memoryless amplitude predistortion block performing memoryless amplitude predistortion on the amplitude memory subtracted signal; and
d. a memory-based phase predistortion block, the memory-based phase predistortion block performing memory-based phase predistortion on the output of the memoryless amplitude predistortion block.

26. The system as recited in claim 25 wherein the predistortion parameter analyzer comprises:
  a. a means for determining the memory-based AM/AM model modeling the memoryless effects and the memory effects in the amplitude of the output signal;
  b. a means for determining the memoryless AM/AM model modeling the memoryless effects in the amplitude of the output signal;
  c. a means for determining the memoryless amplitude predistortion model performing memoryless amplitude predistortion on the amplitude memory subtracted signal; and
  d. a means for determining a memory-based phase predistortion model performing memory-based phase predistortion on the output of the memoryless amplitude predistortion block.

27. The system as recited in claim 25 wherein the system further comprises an input correction filter, the input correction filter implementing the inverse model of the linear response of the power amplifier on the output of the memory-based phase predistortion block.

28. The system as recited in claim 27 wherein the predistortion parameter analyzer further comprises a means for determining the input correction filter.

* * * * *